(12) United States Patent
Nierop et al.

(10) Patent No.: US 9,154,126 B2
(45) Date of Patent: Oct. 6, 2015

(54) HIGH VOLTAGE OUTPUT DRIVER (75) Inventors: Pieter Gustaaf Nierop, Nijmegen (NL);
Clemens Gerhardus Johannes de Haas, Ewijk (NL); Luc Van Dijk, Kranenburg (DE)

(73) Assignee: NXP B.V., Eindhoven (NL)

( * ) Notice: Subject to any disclaimer, the term of this patent is extended or adjusted under 35 U.S.C. 154(b) by 634 days.

(21) Appl. No.: 12/904,844

(22) Filed: Oct. 14, 2010

(65) Prior Publication Data
US 2012/0092043 A1 Apr. 19, 2012

(51) Int. Cl.
*H03K 3/00* (2006.01)
*H03K 17/687* (2006.01)

(52) U.S. Cl.
CPC ................... *H03K 17/6874* (2013.01)

(58) Field of Classification Search
USPC .................................................. 327/108, 112
See application file for complete search history.

(56) References Cited

U.S. PATENT DOCUMENTS

| | | | | |
|---|---|---|---|---|
| 6,030,873 A * | 2/2000 | Iwamatsu et al. | ............. | 438/295 |
| 6,058,028 A * | 5/2000 | Czerwinski | ...................... | 363/44 |
| 6,124,613 A | 9/2000 | Kokubun | | |
| 6,137,703 A * | 10/2000 | Julian et al. | .................... | 363/127 |
| 2004/0200663 A1 * | 10/2004 | Kifuku et al. | ................. | 180/443 |
| 2005/0001659 A1 * | 1/2005 | Inoshita | ......................... | 327/108 |
| 2009/0284447 A1 * | 11/2009 | Koizumi et al. | ................ | 345/60 |
| 2010/0052648 A1 * | 3/2010 | Iwabuchi et al. | ............. | 323/351 |
| 2010/0321966 A1 * | 12/2010 | Mochikawa et al. | ......... | 363/123 |

FOREIGN PATENT DOCUMENTS

| | | |
|---|---|---|
| GB | 2 323 226 A | 9/1998 |
| WO | 2009/126930 A2 | 10/2009 |

OTHER PUBLICATIONS

Extended European Search Report for European Patent Appln. No. 11184371.0 (Apr. 11, 2014).

* cited by examiner

*Primary Examiner* — Ryan Jager (57) ABSTRACT

An output driver circuit is provided. In accordance with various example embodiments, an output driver circuit includes a high-side driver circuit having transistors coupled in anti-series between a power source and an output node, and a low-side driver circuit having transistors coupled in anti-series between the output node and ground. For each transistor, a diode is connected between the source and drain of the transistor, with the diodes of the respective high-side and low-side circuits being arranged to prevent/mitigate the flow of current in opposite directions.

9 Claims, 5 Drawing Sheets

HIGH VOLTAGE OUTPUT DRIVER

Aspects of various embodiments of the present invention are directed to an output driver, and in specific embodiments, to an integrated push-pull high voltage output driver.

An output driver is a circuit for driving an output terminal to which a load is connected. The load can be a semiconductor or integrated circuit designed to perform a specific application having specific voltage or current needs. Generally, a push-pull type driver is widely used as the output driver. The push-pull type driver has a form of a CMOS inverter constituted with a pull-up PMOS transistor and a pull-down NMOS transistor serially connected to each other between a power supply voltage terminal and a ground voltage terminal. Frequently the power supply voltage terminal and the ground voltage terminal are connected to a system-wide supply and ground, respectively.

These and other matters have presented challenges to the manufacture and implementation of output drivers and related devices.

Various example embodiments are directed to driver circuits, such as those that can be used to drive a bus or otherwise connected to a load.

In accordance with an example embodiment, a high voltage driver circuit (e.g., for rail to rail operation) is provided. The high voltage driver includes a high-side driver circuit including two transistors connected between a power source and an output node, with the sources or the drains of the transistors connected to each other in anti-series. In some implementations, the drain of one of the transistors is connected to an output node, and the drain of the other one of the transistors is connected to a power source, with the sources being connected to each other (in anti-series). In other implementations, the source of one of the transistors is connected to the output node and the source of the other one of the transistors is connected to the power source, and the drains of the transistors are connected to each other (in anti-series). As used herein, the term "anti-series" as used in the context of connecting two transistors, is defined as interconnecting the respective terminals of transistors (as in sources or drains of FETs); for example, two transistors are connected to one another in anti-series when their respective sources/drains are connected to provide an effective short circuit as would be provided by interconnecting at a common node or by way of a negligible-impedance material or structure. Two FETs are not connected in anti-series when the source of one of the FETs is interconnected to the drain of the other one of the FETs, or when a circuit component is connected between the (source or drain) terminals of two FETs.

The high voltage driver further includes a low-side driver circuit having two transistors connected between the output node and ground, with the sources or drains of the transistors connected to one other. In one implementation, the drain of one of the transistors is connected to the output node and the drain of the other one of the transistors is connected to ground, with the sources being connected to one other. In another implementation, the source of one of the transistors is connected to the output node and the source of the other one of the transistors is connected to ground, with the drains being connected to each other.

The high-side driver circuit also includes a diode connected between the source and drain of one of the transistors, and another diode connected between the source and drain of the other one of the transistors. The diodes are connected to the transistors so that current flow between the power source and the output node is prevented in opposite directions.

The low-side driver circuit also includes a diode connected between the source and drain of one of the transistors, and another diode connected between the source and drain of the other one of the transistors. The diodes are connected to the transistors so that current flow between the power source and the output node is prevented in opposite directions.

In accordance with another example embodiment, particular fault conditions that can cause the output voltage of drivers to be far below or above its nominal value are mitigated or prevented. A driver circuit as described above is arranged to inhibit current flow between the driver's output and ground and/or supply connections of the driver when a fault condition is detected. The driver circuit prevents the unwanted current flow through the use of transistors and diodes in anti-series. Paired transistors and diodes are used to provide an output voltage without a diode voltage drop between the supply and output or output and ground when the circuit is in functional mode.

In accordance with another example embodiment of the present invention, a high voltage driver circuit includes a power source, ground and output node for driving an output circuit such as a bus or other load. The circuit includes a high-side driver circuit including two transistors connected between the power source and the output node, with either the sources or drains of the transistors connected to one another in a manner similar to that as described above (e.g., in anti-series). The circuit further includes a low-side driver circuit including two transistors connected between the output node and ground, with either the sources or drains of the transistors connected to one another, also in a manner similar to that as described above.

In the high-side driver circuit, a diode is connected between the source and drain of one of the transistors, and another diode is connected between the source and drain of the other one of the transistors. The respective diodes are configured and arranged to prevent current flow between the power source and output node in opposite directions.

In the low-side driver circuit, a diode is connected between the source and drain of one of the transistors, and another diode is connected between the source and drain of the other one of the transistors. The respective diodes are configured and arranged to prevent current flow between the output node and ground in opposite directions.

A control circuit is configured to provide a first signal to the high-side driver circuit to switch on the transistors of the high-side driver circuit. The control circuit is also configured to provide a second signal to the low-side driver circuit to switch on the transistors of the low-side driver circuit. The output node is configured to provide an output signal when the transistors of the high-side driver circuit or the transistors of the low-side driver circuit have been turned on.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

Aspects of present the invention are believed to be applicable to a variety of different types of drivers and related circuits, for driving a variety of different types of circuits. While the present invention is not necessarily so limited, various aspects of the invention may be appreciated through a discussion of examples using this context.

Various aspects of the present disclosure are directed to a high voltage output driver circuit. The driver circuit includes a high side circuit and a low side circuit. The high-side circuit is situated between a supply voltage and an output to the output driver, and the low-side circuit is situated between the output and ground. The components of the output driver are arranged so that when the output driver is in a functional mode, the voltage drop is generally limited to that caused by the on-resistance of the transistors in the circuit. When not in the functional mode (in an inactive mode), diodes in the output driver are arranged to mitigate current flow between the supply and the output, and between the output and ground. The dual functionality of limiting voltage drop during the functional mode and the preventing current flow in the inactive mode is achieved by arranging each transistor in parallel with a diode. The diode and transistor are arranged in parallel to facilitate current flow through the transistor when the gate source voltage exceeds the transistor threshold voltage, and to mitigate/prevent current flow when the gate and source of the transistor are shorted (e.g., the diodes prevent nearly all current flow in one direction, with some leakage possible).

According to another example embodiment, a high voltage output driver with rail to rail high voltage capability is provided. The high voltage output driver includes a high-side driver circuit and a low-side driver circuit, with the output of the high voltage output driver located between the high-side driver circuit and the low-side driver circuit. The high-side driver circuit includes two power components connected in anti-series. The low-side driver circuit also includes two power components connected in anti-series. Each of the power components includes a transistor and a diode. The diode is connected between the source and drain of the transistor for each power component. The gates of the transistors of the two power components in the high-side driver circuit are connected. The gates of the transistors of the two power components in the low-side driver circuit are connected.

In the high-side driver circuit, the drain of one of the transistors is connected to a power supply, and the drain of the other transistor is connected to the output of the high voltage output driver. A high-side driver (e.g., a controller) controls the two power components of the high-side driver circuit.

In the low-side driver circuit, the drain of one of the transistors is connected to a power supply, and the drain of the other transistor is connected to the output of the low voltage output driver. A low-side driver (e.g., controller) controls the two power components of the low-side driver circuit.

When the gate-source voltage of a transistor in one of the power components exceeds the threshold, the transistor conducts current. When the gate and source of a transistor in one of the power components are shorted, no current can flow from the power supply to the output or in the reverse direction. This bi-directional current stop is achieved through the anti-series arrangement of the power components.

In certain more specific embodiments the power components include MOS transistors, which can be n-type or p-type transistors. In various embodiments the MOS transistors in the power components of the high-side driver circuit and the low-side driver are not the same type. In other embodiments all four MOS transistors are the same type. The use of n-type or p-type transistors affects the configuration and type of driver used for the high-side driver circuit and the low-side driver circuit.

In certain embodiments of the present disclosure a high voltage output driver with rail to rail high voltage capability is provided. The high voltage output driver includes a high-side driver circuit including two transistors connected between a power source and an output-driving output node, the gates and sources of the transistors are connected to each other, the drain of one of the transistors is connected to the output node and the drain of the other one of the transistors is connected to the power source. The high voltage output driver further includes a low-side driver circuit including two transistors connected between the output node and ground, the gates and sources of the transistors are connected to each other, the drain of one of the transistors is connected to the output node and the drain of the other one of the transistors is connected to ground.

The high-side driver circuit also includes a diode connected between the source and drain of one of the transistors, and another diode connected between the source and drain of the other one of the transistors. The diodes are connected to the transistors so that current flow between the power source and the output node is prevented in opposite directions.

The low-side driver circuit also includes a diode connected between the source and drain of one of the transistors, and another diode connected between the source and drain of the other one of the transistors. The diodes are connected to the transistors so that current flow between the power source and the output node is prevented in opposite directions.

Figure 1:
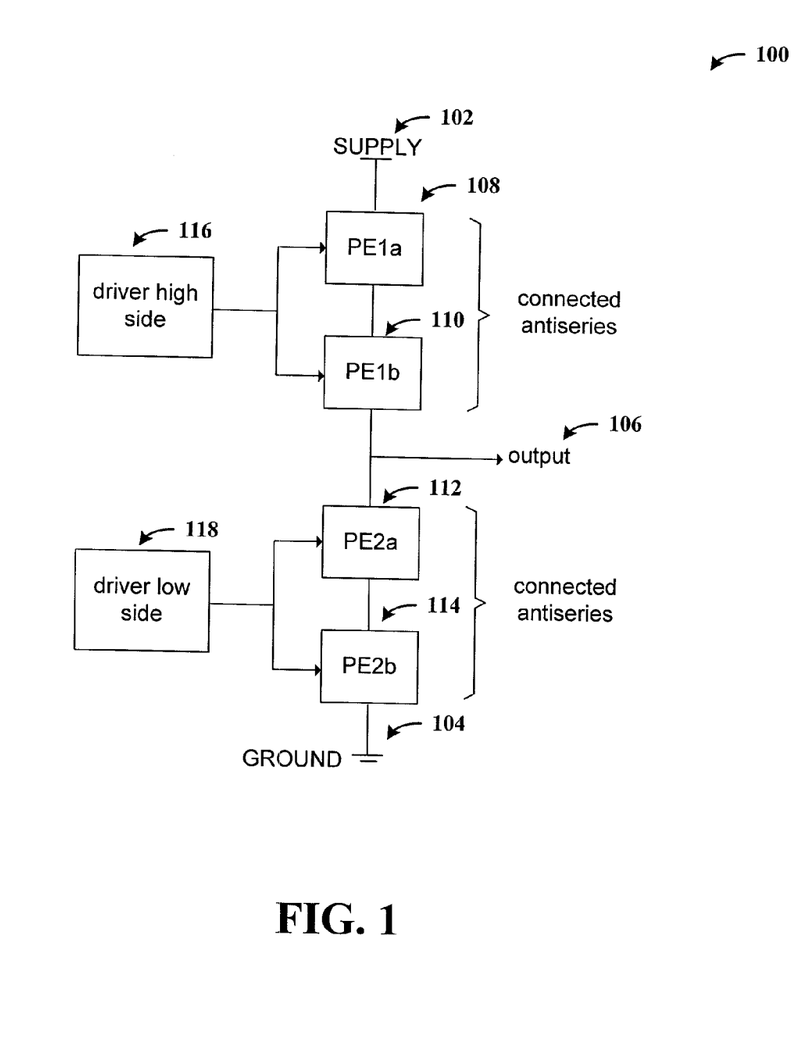
FIG. 1 shows a high voltage driver, in accordance with an example embodiment of the present disclosure.

Turning to FIG. 1, a high voltage driver 100 consistent with the present disclosure is shown. The high voltage driver 100 has a supply 102, a ground 104, and an output 106. Power components 108 and 110 are connected in anti-series between the supply 102 and the output 106. Power components 112 and 114 are connected in anti-series between the output 106 and the ground 104. Power components 108 and 110 are connected to high-side driver 116 and Power components 112 and 114 are connected to low-side driver 118.

Power components 108, 110, 112, and 114 each include a transistor. The gates of the transistors in power components 108 and 110 are connected with each other. The gates of the transistors in power components 112 and 114 are connected with each other. The power components 108, 110, 112, and 114 also include a diode. The diodes in power components 108 and 110 are implemented so that the diodes are in anti-series, i.e., the diodes face in opposite directions. The diodes in power components 112 and 114 are also implement in anti-series.

When the gate-source voltage of the transistors in the power components exceeds the transistor's threshold, the power components conduct current. Any voltage drop that occurs in the power components is a result of the on-resistance of the transistors when the high voltage driver 100 is delivering current to the output 106 in functional mode.

When the gate and source of the transistors in power components 108 and 110 is shorted, no current can flow from the supply 102 to output 106 or reverse. Power components 108 and 110 are configured to mitigate the current flow via the diodes within the power components. Specifically, the anode to cathode direction of the first diode is opposite of the anode to cathode direction of the second diode. When the gate and source of the transistors in power elements 112 and 114 are shorted, little or no current flows from output 106 to ground 104 or reverse. The Power components 112 and 114 are configured to mitigate the current flow by arranging the diodes within the power components so that the anode to cathode direction of the diode in power component 112 is the opposite of the anode to cathode direction of the diode in power component 114.

In certain embodiments the high voltage driver of FIG. 1 is implemented on a printed circuit board (PCB). The arrangement of the high voltage driver prevents the output of the circuit from taking over the ground function of the PCB when a fault condition occurs in which the ground of the printed circuit board becomes disconnected from a system application while the output 106 is still attached to the system application. The arrangement also prevents the output of the circuit from taking over the supply function of the PCB when a fault condition occurs where the supply of the PCB becomes disconnected from a system application while the output 106 is still connected to the system application.

In certain embodiments the driver of FIG. 1 is implemented using silicon on insulator (SOI) technology. The use of SOI allows for isolation of circuit parts and components. The isolation of each transistor and diode results in low parasitic capacitance, and allows the circuit not to be hampered by forward biased parasitic diodes when the operating supply voltage range is exceeded.

Figure 2:
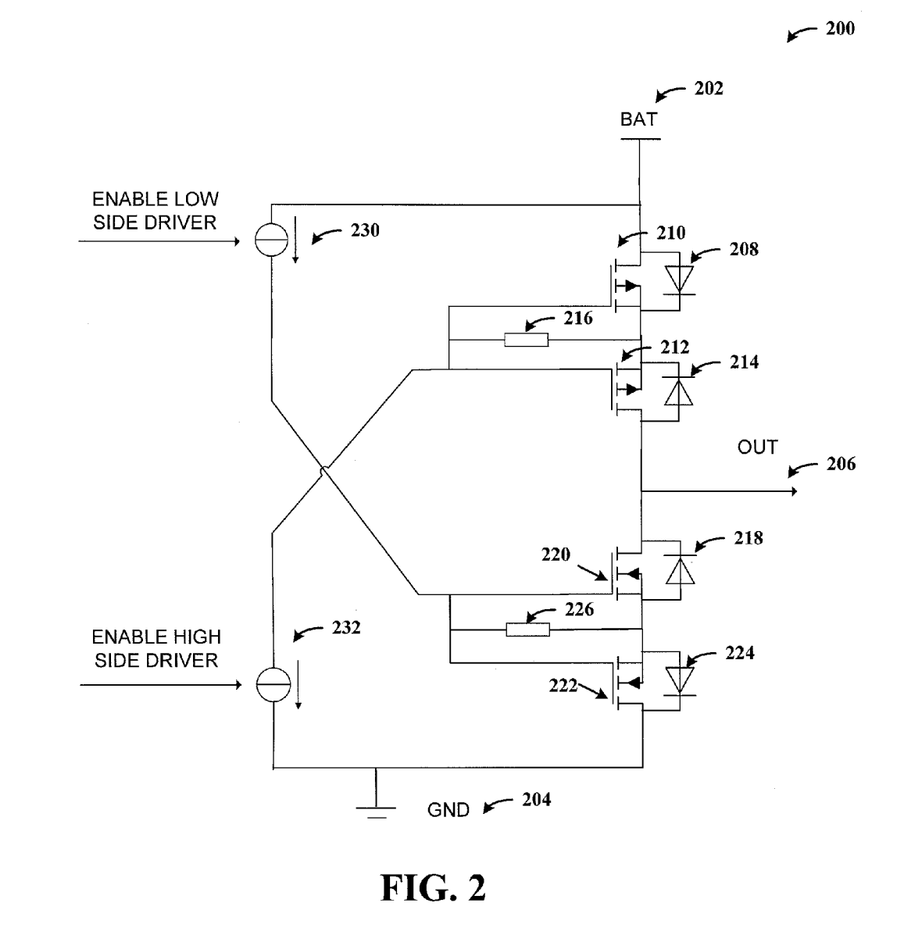
FIG. 2 shows a high voltage output driver, according to other example embodiments of the present disclosure.

FIG. 2 depicts an embodiment of a high voltage driver consistent with the present disclosure. In FIG. 2 high voltage driver 200 includes a battery 202, an output 206 and a ground 204. Two pmos transistors 210 and 212 are arranged between the battery 202 and output 206 so that gates of the pmos transistors 210 and 212 are coupled. The battery 202 is connected to the drain of pmos transistor 210 and the output 206 is connected to the drain of transistor 212. A resistor 216 is connected between the gate and source of both pmos transistor 210 and pmos transistor 212. Resistor 216 is also connected to an enable high-side driver 232. The anode of diode 208 is connected to the drain of pmos transistor 210. The cathode of diode 208 is connected to the source of pmos transistor 210. The anode of diode 214 is connected to the drain of pmos transistor 212. The cathode of diode 214 is connected to the source of transistor 212. Two nmos transistors 220 and 222 are arranged between the output 206 and the ground 204 so that the gates of the nmos transistors 220 and 222 are coupled. The output is connected to the drain of nmos 220 and the ground 204 is connected to the drain of transistor 222. A resistor 226 is connected between the gate and source of both nmos transistor 220 and nmos transistor 222. Resistor 226 is also connected to enable low-side driver 230, which accordingly drives the gates and sources. The anode of diode 218 is connected to the source of nmos transistor 220, and the cathode of diode 218 is connected to the drain of nmos transistor 220. The anode of diode 224 is connected to the source of nmos transistor 222, and the cathode of diode 224 is connected to the drain of nmos transistor 222. Enable low-side driver 230 is connected to battery 202 and enable high-side driver 232 is connected to ground.

In the example embodiment depicted in FIG. 2, a voltage is applied to the pmos transistors 210 and 212 by drawing a current through resistor 216, which is connected between the gate and source of the transistors. Similarly, a voltage is applied to nmos transistors 220 and 222 by drawing a current through resistor 226, which is connected between the gate and source of the transistors.

The high-voltage driver circuit 200 of FIG. 2 is arranged so that the current can flow in the direction desired, when desired. The circuit 200 is also arranged to minimize the voltage drop between the power supply or battery 202 and the output 206. When an enable signal is supplied to the high-side driver 232, for example, a voltage is applied to the transistors 210 and 212 such the gate-source voltage of transistors 210 and 212 passes the transistor's on threshold. Current flows from the supply 202 to output 206 through transistors 210 and 212. The voltage drop arises from the on-resistance of the transistors 210 and 212. When the transistors 210 and 212 are not on, the diodes 208 and 214 become a possible current path. However, because the diodes are arranged in anti-series (i.e., the diodes face in opposite directions), regardless of the direction current is attempting to flow, a diode is arranged in the path in a manner to prevent current flow. This arrangement allows for current flow to be mitigated or stopped either when no current is desired at output 206, or in the situation where current may attempt to flow in an undesirable direction because a fault condition has occurred.

Figure 3:
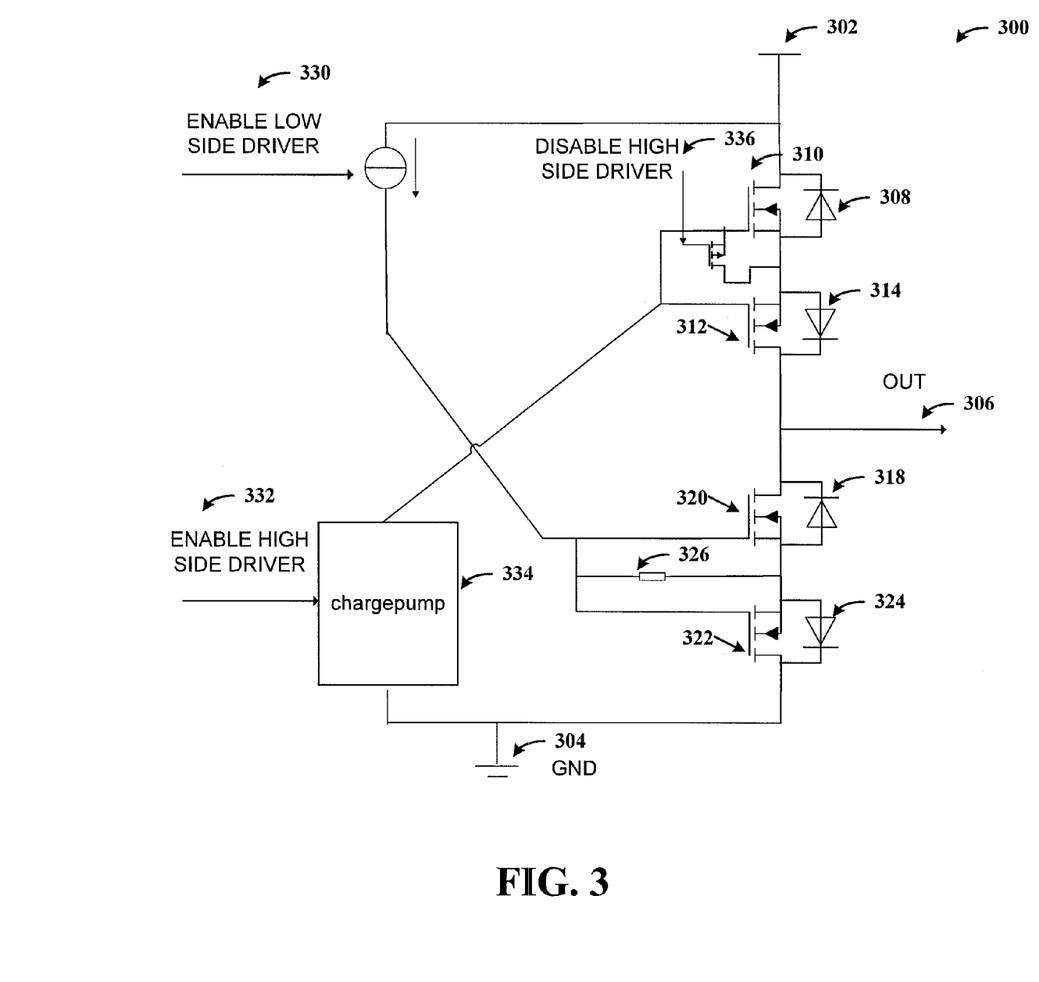
FIG. 3 shows a high voltage output driver, according to another example embodiment of the present disclosure.

FIG. 3 depicts an example embodiment consistent with the present disclosure. In the example embodiment depicted in FIG. 3, a high voltage driver circuit 300, similar to that shown in FIG. 2, includes a charge pump 334 that, in response to receiving an enable high-side signal, provides the voltage necessary to short the gates and sources of the transistors 310 and 312. The high voltage driver circuit 300 uses four nmos transistors instead of a combination of two nmos transistors and two pmos transistors. The change in transistor type requires a change in the drivers that control the transistors. In addition to the charge pump 334, the high voltage driver circuit 300 also includes an additional nmos transistor 336 used to disable the high-side driver.

Figure 4:
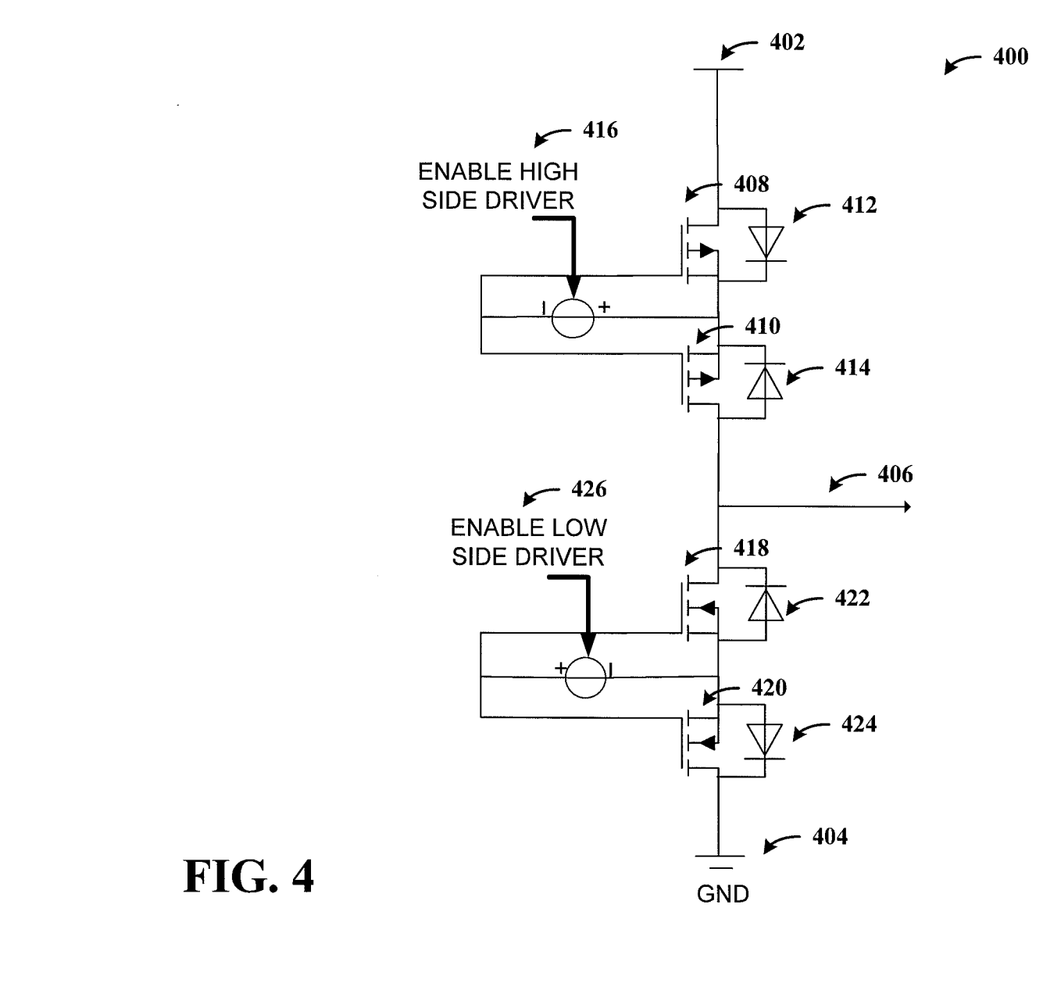
FIG. 4 shows a high voltage output driver, according to another example embodiment of the present disclosure.

FIG. 4 depicts an embodiment of a high voltage driver 400, which can be implemented with rail to rail capability, consistent with an embodiment of the present invention. The high voltage driver 400 includes a supply 402, a ground 404, and an output 406. The gates of pmos transistors 408 and 410 are connected. The sources of pmos transistors 408 and 410 are connected to each other as well as to enable high-side driver 416. The drain of pmos transistor 408 is connected to supply 402 and the drain of pmos transistor 410 is connected to output 406. The anode of diode 412 is connected to the supply 402 and the drain of pmos transistor 408. The cathode of diode 412 is connected to the source of pmos transistor 408. The anode of diode 414 is connected to the drain of pmos transistor 410 and the cathode of diode 414 is connected to the source of pmos transistor 414. The gates of nmos transistors 418 and 420 are connected to each other. The sources of nmos transistors 418 and 420 are connected to enable low-side driver 426 and to each other. The drain of nmos transistor 420 is connected to ground and the drain of nmos transistor 418 is connected to output 406. The anode of diode 422 is connected to the source of nmos transistor 418, and the cathode of diode 422 is connected to the drain of nmos transistor 418. The arrangement of the transistors 408, 410, 418 and 420 in connection with the diodes 412, 414, 422 and 424, allows the circuit to function so that when the transistors are on, the transistors act like a short with minimal voltage drop. When the transistors are off, the diodes serve to prevent current flow in either direction. The high voltage driver 400 is arranged so that pmos transistors 408 and 410 are turned on and off together. Similarly, nmos transistors 418 and 420 are turned on and off together. Whether pmos transistors 408 and 410 are on, allowing for current to flow from the supply 402 to the output 406 is controlled by enable high-side driver 416. Similarly, whether nmos transistors 418 and 420 are on allowing for current to flow from output 406 to ground 404 is controlled by enable low-side driver 426.

Figure 5:
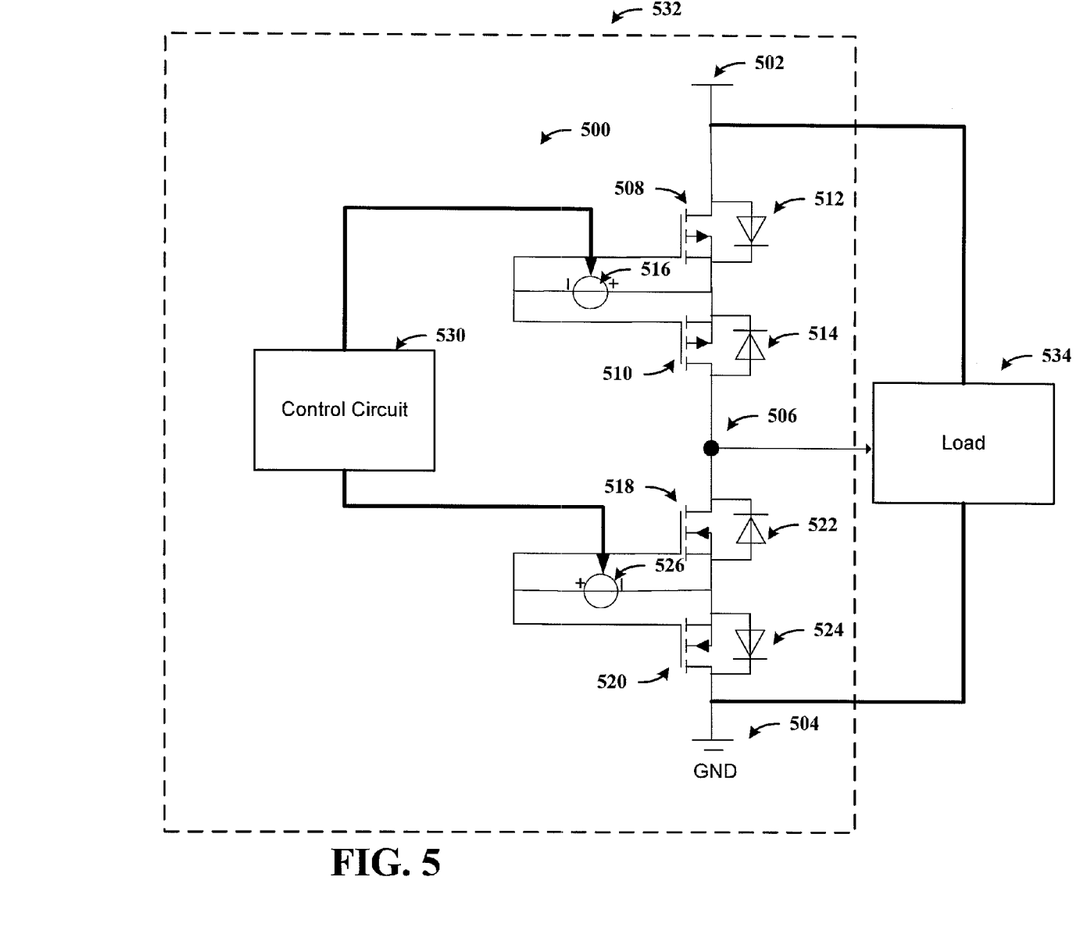
FIG. 5 shows a high voltage output driver connected to a load, according to another example embodiment of the present disclosure.

FIG. 5 depicts a high voltage output driver connected to a load 534, such as a bus or a load, consistent with another example embodiment of the present disclosure. The high voltage driver 500 includes a supply 502, a ground 504, and an output 506. The gates of pmos transistors 508 and 510 are connected. The sources of pmos transistors 508 and 510 are connected to each other as well as to enable high-side driver 516. The drain of pmos transistor 508 is connected to supply 502 and the drain of pmos transistor 510 is connected to output 506. The anode of diode 512 is connected to the supply 502 and the drain of pmos transistor 508. The cathode of diode 512 is connected to the source of pmos transistor 508. The anode of diode 514 is connected to the drain of pmos transistor 510 and the cathode of diode 514 is connected to the source of pmos transistor 514. The gates of nmos transistors 518 and 520 are connected to each other. The sources of nmos transistors 518 and 520 are connected to enable low-side driver 526 and to each other. The drain of nmos transistor 520 is connected to ground and the drain of nmos transistor 518 is connected to output 506. The anode of diode 522 is connected to the source of nmos transistor 418, and the cathode of diode 522 is connected to the drain of nmos transistor 518.

The arrangement of the transistors 508, 510, 518 and 520 in connection with the diodes 512, 514, 522 and 524, allows the circuit to function so that when the transistors are on, the transistors act like a short with minimal voltage drop. When the transistors are off, the diodes serve to prevent current flow in either direction. The high voltage driver 500 is arranged so that pmos transistors 508 and 510 are turned on and off together. Similarly, nmos transistors 518 and 520 are turned on and off together.

The high-side driver 516 is configured to receive an enable signal from control circuit 530, and to respond to the enable signal by controlling the pmos transistors 508 and 510 in an on or off state for connecting the supply 502 and the output 506. Similarly, the low-side driver 516 is configured to receive an enable signal from control circuit 530, and to respond to the enable signal by controlling nmos transistors 518 and 520 in an on or off state for connecting the output 506 and ground 504. The high voltage output driver 500 is implemented on a printed circuit board (PCB)n 532. The output 506 of high voltage output driver 500 is provided to load 534. The supply 502 of the high-voltage output driver 500 also provides the power supply for the load 534. Similarly, the same ground 504 is the ground for both the high-voltage output driver circuit 500 and the load 534.

The transistor-diode pairs in the high-voltage output driver 500 are arranged in anti-series. For example, the arrangement of transistors 508 and 510 with diodes 512 and 514 respectively, allows for current to flow from the supply 502 to the output 506 when the gate-source voltage has reached the threshold of transistors 508 and 510. When the transistors 508 and 510 are on, the only voltage drop between the supply 502 and the output 506 is the on-resistance of the two transistors. In a situation where the ground becomes disconnected from load 534, the gate and source of the transistors 508 and 510 are shorted, and the only available current path is through diodes 512 and 514. However, the arrangement of diodes 512 and 514 in anti-series (i.e., the diodes point in opposite directions) mitigates/prevents current cannot flow between the output node and the supply node (in either direction). Similarly, transistors 518 and 520 and diodes 522 and 524 are arranged so current can flow between output 506 and ground 504 when the gate-source voltage threshold of the transistors 518 and 520 has been reached, turning on the transistors. In a situation where the supply 502 becomes disconnected from load 534, the gate and source of transistors 518 and 520 are shorted, and the only remaining potential current path is through diodes 522 and 524. However, because diodes 522 and 524 are arranged in anti-series (i.e., the diodes point in opposite directions), current flow from the output node to ground and vice versa is mitigated or stopped.

The following discussion characterizes multiple example embodiments involving driver circuits such as those described herein. Accordingly, these embodiments may be implemented in connection with one or more of the driver circuits as discussed above.

Certain embodiments are directed to an integrated push/pull high voltage output driver circuit for general purpose applications, that has an extended absolute maximum voltage rating without having reverse currents, and that has rail to rail driver capability. For example, when used with a bus having a +12 V supply and a −12 V supply, the driver circuit provides voltage across the range from −12V to +12 V. The maximum range of the output driver is specified from −28V to 40V. This is independent from the operating supply-voltage that is specified from 0 to 28V.

In certain more specific embodiments the high voltage driver circuit is connected to a bus for automotive applications. For example, the high voltage driver circuit can be used in connection with windshield wipers, power windows, power sliding doors, sun or moon roofs, Anti-lock braking systems (ABS), or engine control. Multiple high voltage driver circuits can be used within a larger system, with each circuit providing power and control to a single application.

In certain more specific embodiments, a driver circuit as discussed herein is configured to mitigated undesirable aspects of one or more fault conditions. One type of fault condition occurs when the ground of a printed circuit board (PCB) the high-voltage driver circuit is implemented on becomes disconnected from a system application, while the output is still connected to the system application (e.g., in a "loss of ground" condition). It is desirable in such a situation that the output of the high voltage driver not take over the ground function of the PCB.

In various embodiments, a high-voltage driver circuit consistent with the present disclosure is configured so that in response to detection of a loss of ground fault, the low-side enable driver ceases to supply voltage to the transistors it is connected to, thereby turning the transistors off. The driver includes diodes arranged so that current cannot flow either from the output of the circuit to ground or from ground to the output when the transistors are turned off. This arrangement prevents the output of the high voltage driver from taking over the ground function of the PCB.

In certain embodiments a driver circuit consistent with one or more embodiments as discussed herein is configured to mitigate undesirable aspects of a second type of fault condition. For example, in a "loss of battery" fault, the supply of the PCB becomes disconnected from the system application, while the output is still connected to the system application. Under such a fault condition, the driver circuit is configured to present undesirable circuit operation, such as to prevent the output of the high voltage driver from taking over the supply function of the PCB.

In various embodiments, a high-voltage driver is configured so that in response to detection of a loss of battery fault, the high-side enable driver ceases to supply voltage to the transistors it is connected to, thereby turning the transistors off. The diodes are arranged so that current cannot flow either from the battery to the output of the circuit or from the output to the battery when the transistors are turned off. This arrangement prevents the output of the high voltage driver circuit from taking over the supply function of the PCB.

Based upon the above discussion and illustrations, those skilled in the art will readily recognize that various modifications and changes may be made to the present invention without strictly following the exemplary embodiments and applications illustrated and described herein. For example, the described drivers may be implemented with other circuits, including circuitry for automotive applications such as throttle control, brake control, power windows, and others. The various embodiments as described herein may also be implemented with industrial application control, such as for machinery used in the production of goods, or with computer systems in a variety of applications, including vehicular applications in addition to automotive as described above (e.g., off-road vehicles, trains, airplanes and space vehicles). Such modifications do not depart from the true spirit and scope of the present invention, including that set forth in the following claims.

What is claimed is:

1. A push-pull output driver circuit comprising:
   a high-side driver circuit including two transistors connected between a power source and an output node, the transistors connected to one another in anti-series and responsive to a first control signal;
   a low-side driver circuit including two transistors connected between the output node and ground, the transistors connected to one another in anti-series and responsive to a second control signal;
   for the high-side driver circuit, a diode connected between the source and drain of one of the transistors, and another diode connected between the source and drain of the other one of the transistors, the respective diodes being configured and arranged to prevent current flow between the power source and output node in opposite directions;
   for the low-side driver circuit, a diode connected between the source and drain of one of the transistors, and another diode connected between the source and drain of the other one of the transistors, the respective diodes being configured and arranged to prevent current flow between the output node and ground in opposite directions; and
   wherein the high-side and low-side driver circuits respond to the first and second control signals for push-pull driving of the output node, wherein the high-side driver circuit further includes a charge pump configured to apply a voltage to short the gates and the connected source/drain active regions of the high-side driver circuit transistors.

2. A high voltage driver circuit comprising:
   a power source;
   a ground circuit;
   an output node connected to a load;
      a high-side driver circuit including two transistors connected in anti-series between the power source and the output node;
      a low-side driver circuit including two transistors connected in anti-series between the output node and ground;
      for the high-side driver circuit, a diode connected between the source and drain of one of the transistors, and another diode connected between the source and drain of the other one of the transistors, the respective diodes being configured and arranged to mitigate current flow between the power source and output node;
      for the low-side driver circuit, a diode connected between the source and drain of one of the transistors, and another diode connected between the source and drain of the other one of the transistors, the respective diodes being configured and arranged to mitigate current flow between the output node and ground;
   a control circuit including
      a first circuit connected between ground and the high-side driver circuit and configured to provide a first signal to the high-side driver circuit to switch on the transistors of the high-side driver circuit, and
      a second control circuit connected between the low-side driver circuit and the power source and configured to provide a second signal to the low-side driver circuit to switch on the transistors of the low-side driver circuit; and
   wherein the output node is configured to provide an output signal to the load when the transistors of the high-side driver circuit or the transistors of the low-side driver circuit have been turned on.

3. The circuit of claim 2, wherein each the transistors is respectively configured to operate in an on state to bypass the diode connected between the source and drain of the transistor.

4. The circuit of claim 2, wherein
   the high-side driver circuit includes
      a first high-side transistor having a source/drain region connected to the power source,
      a second high-side transistor having a source/drain region connected in anti-series with a source/drain region of the first high-side transistor that is not connected to the power source, and having another source/drain region connected to the output node, and
      each high-side transistor having a gate/source region that is driven by a control circuit; and
   the low-side driver circuit includes
      a first low-side transistor having a source/drain region connected to the output node,
      a second low-side transistor having a source/drain region connected in anti-series with a source/drain region of the first low-side transistor that is not connected to the output node, and having another source/drain region connected to the ground circuit, and
      each low-side transistor having a gate/source region that is driven by a control circuit.

5. The circuit of claim 2, wherein the two transistors of at least one of the high-side driver circuit and the low-side driver circuit are of the same conductivity type.

6. The circuit of claim 2, wherein the transistors of the high-side driver circuit have a conductivity type that is opposite the conductivity type of the transistors of the low-side driver circuit.

7. The circuit of claim 2, wherein the diodes of the high-side driver circuit are oriented in opposite directions relative to one another, and the diodes of the low-side driver circuit are oriented in opposite directions relative to one another, to respectively mitigate the passage of current between the output node and the power source on the high-side circuit, and between the output node and the ground circuit on the low-side circuit, when the transistors are in an off state.

8. An output driver circuit comprising:
   a high-side driver circuit connected between a power source and an output for driving a load, and including transistors connected to one another in anti-series and in parallel with diodes, the diodes being arranged to mitigate the flow of current between the power source and the output via when the transistors are off;

a low-side driver circuit connected between the output and ground, and including transistors connected to one another in anti-series and in parallel with diodes, the diodes being arranged to mitigate the flow of current between the output and ground when the transistors are off; and a control circuit including a first circuit connected between the high-side driver circuit and ground and configured to switch the transistors of the high-side driver circuit on to drive the output high, and a second circuit connected between the low-side driver circuit and the power source and configured and arranged to switch the transistors of the low-side driver circuit on to drive the output low.

9. The circuit of claim 8, wherein the diodes of the high-side output driver circuit are oriented in opposite directions relative to one another to mitigate the passage of current between the output and the power source, and the diodes of the low-side output driver circuit are oriented in opposite directions relative to one another to mitigate the passage of current between the output and ground.

\* \* \* \* \*